United States Patent [19]
Stephens et al.

[11] Patent Number: 6,120,602
[45] Date of Patent: Sep. 19, 2000

[54] METHOD AND APPARATUS FOR FABRICATING NEAR SPHERICAL SEMICONDUCTOR SINGLE CRYSTAL PARTICULATE AND THE SPHERICAL PRODUCT PRODUCED

[75] Inventors: Matthew D. Stephens, Somerville; Steven A. Miller, Canton; Jessica Belcher, Medford, all of Mass.

[73] Assignee: Starmet Corporation, Concord, Mass.

[21] Appl. No.: 09/473,867

[22] Filed: Dec. 28, 1999

Related U.S. Application Data

[62] Division of application No. 09/173,434, Oct. 15, 1998.

[51] Int. Cl.⁷ .......................... C30B 35/00; C30B 17/00
[52] U.S. Cl. ...................... 117/200; 117/202; 117/206; 117/223; 117/902; 117/931
[58] Field of Search .................... 117/200, 202, 117/206, 223, 902, 931

[56] References Cited

U.S. PATENT DOCUMENTS

| | | | |
|---|---|---|---|
| 3,998,659 | 12/1976 | Wakefield | 136/250 |
| 3,999,950 | 12/1976 | Nagorsen | 117/206 |
| 4,021,323 | 5/1977 | Kilby et al. | 136/246 |
| 4,322,379 | 3/1982 | Kilby et al. | 264/13 |
| 4,354,987 | 10/1982 | Iya | 264/13 |
| 4,425,408 | 1/1984 | Levine et al. | 428/403 |
| 4,430,150 | 2/1984 | Levine et al. | 117/73 |
| 4,582,534 | 4/1986 | Torobin | 75/229 |
| 4,637,855 | 1/1987 | Witter et al. | 117/76 |
| 4,643,587 | 2/1987 | Makabe et al. | 374/104 |
| 4,806,357 | 2/1989 | Garret et al. | 428/402 |
| 5,028,546 | 7/1991 | Hotchkiss | 438/63 |
| 5,069,740 | 12/1991 | Levine et al. | 117/81 |
| 5,227,239 | 7/1993 | Upadhye et al. | 428/402 |
| 5,269,637 | 12/1993 | Gomes, Jr. | 406/173 |
| 5,352,269 | 10/1994 | McCandlish et al. | 75/351 |
| 5,420,744 | 5/1995 | Asada et al. | 75/351 |
| 5,431,127 | 7/1995 | Stevens et al. | 117/75 |
| 5,614,020 | 3/1997 | Stevens et al. | 117/205 |

OTHER PUBLICATIONS

Cochrane, R.F. et al., "Containerless solidification of alloys in a drop–tube", Material Science Engineering vol. 98:99–103, 1988.

Madelung, O. et al. (Eds.), "Semiconductors: Technology of III–V, II–VI and non–tetrahedrally–bonded compounds", Landold–Bornstein, vol. 17d (New York: Springer–Verlag):27, 1984.

Lide, David R. et al. (Ed.), "CRC Handbook of Chemistry and Physics", 71st Ed. (Cleveland, OH: Chemical Rubber Pub. Co.): 1254–1256, 1990.

Primary Examiner—Benjamin L. Utech
Assistant Examiner—Donald L. Champagne
Attorney, Agent, or Firm—Iandiorio & Teska

[57] ABSTRACT

An apparatus and a method for producing single crystal semiconductor particulate in near spherical shape and the particulate product so formed is accomplished by producing uniform, monosized, near spherical droplets; identifying the position of an undercooled droplet in a nucleation zone; and seeding the identified droplet in the nucleation zone to initiate single crystal growth in the droplet.

33 Claims, 9 Drawing Sheets

METHOD AND APPARATUS FOR FABRICATING NEAR SPHERICAL SEMICONDUCTOR SINGLE CRYSTAL PARTICULATE AND THE SPHERICAL PRODUCT PRODUCED

This is a division of application Ser. No. 09/173,434, filed on Oct. 15, 1998.

FIELD OF INVENTION

This invention relates to a method and apparatus for fabricating near spherical single crystal particulate and to the spherical product produced, and more particularly to such a method, apparatus and product made of a semiconductor material such as silicon.

BACKGROUND OF INVENTION

Single crystal silicon spheres provide an ideal means of fabricating high efficiency photovoltaic devices. These devices are described in U.S. Pat. Nos. 4,021,323 and 5,028,546. The desired size of such spheres is approximately 750 microns in diameter. Most recently technology is being developed to use single crystal silicon spheres as well as other semiconductor materials as substrates in integrated circuits. Current applications envision the use of 1000 micron spheres, but ultimately a wide range of sizes to accommodate different circuitry is likely. In addition, it is likely that such applications will utilize spheres of other semiconductor materials, including germanium, gallium arsenide, and $CuInGaSe_2$.

Silicon, unlike conventional materials, is difficult to form into spheres by such techniques as gas atomization, rotary atomization or shotting. During solidification a volume expansion occurs that causes spherical liquid silicon droplets to distort into highly irregular particulate. The irregular particulate that results requires extensive and expensive subsequent processing as described in U.S. Pat. No. 4,430,150 to convert the particles to a usable form. As a result other processes as described in U.S. Pat. No. 4,637,855 for spheroidizing individual grains of silicon and U.S. Pat. Nos. 5,431,127 and 5,614,020 for fusing and spheroidizing measured amounts of loose silicon powder have been developed. Some of these patents also describe how to heat silicon particulate to melt it and then cool the silicon from the molten state such that single crystal particulate is formed.

All of these processes require multiple manufacturing steps in order to produce single crystal silicon. It is well established in materials manufacturing that the more discrete steps there are in a manufacturing process the more costly the overall process. Thus all of the above manufacturing routes are inherently expensive as they first require particulate formation followed by additional special processes to convert the particulate to single crystals.

Kirby in U.S. Pat. No. 4,322,379 describes a unique process for producing near spherical, or tear drop shaped silicon particles that are almost single crystals, "usually having less than 5 crystallites in an 0.01 inch body" (250 microns) directly from the melt in a one step process.

SUMMARY OF INVENTION

It is therefore an object of this invention to provide an improved method and apparatus for making a near spherical single crystal semiconductor particulate and the spherical product thereof.

It is a further object of this invention to provide such a method, apparatus and product in which the desired shape and single crystal structure are formed in a single operation.

It is a further object of this invention to provide such a method and apparatus that are simpler, quicker, less expensive than prior art, and provide a product with superior properties.

It is a further object of this invention to provide such a method, apparatus and product which can form solid or hollow microballoon, single crystal semiconductor spherical particulate.

The invention results from the realization that near spherical solid single and hollow, even more nearly spherical, single crystals of adamantine semiconductors can be made directly from the melt in a single step process where solid or hollow droplets of molten material issue in a carefully controlled thermal environment. The thermal environment is controlled to produce a desirable level of undercooling in the drop without inducing crystallization. The droplet is cooled to an appropriate temperature without inducing crystallization and then seeded to provide only one crystal nucleation site. Heterogeneous nucleation induces solidification. By controlling the environment of the droplet, all of the liquid is consumed and a single crystal particulate is formed. The monosize droplet generator ensures that each droplet is the same size and therefore can be processed in precisely the same manner. This identical processing of all the droplets is impossible with stochastic processes such as gas atomization that produce a wide range of droplet sizes. In the case of solid droplets, near-spherical teardrop shaped single crystal particulate is formed; in the case of hollow droplets or bubbles, the hollow single crystal particulate formed is more nearly spherical.

This invention features an apparatus for producing single crystal particulate in near spherical shape including a uniform droplet generation system for producing uniform monosized, near spherical droplets, and a nucleating system including a nucleation zone, a single crystal seeding device and a monitoring device for identifying the position of a droplet in the nucleation zone and actuating the seeding device to initiate a single crystal growth in the droplet.

In a preferred embodiment the particulate may be silicon or another semiconductor. The nucleating device may include means for contacting a droplet with a single crystal particle of the same material as the particulate. The means for contacting may include a probe or a particle launcher. The monitoring device may include means for sensing the temperature of a droplet in the nucleation zone. There may be heating means responsive to the means for sensing the temperatures of a droplet for maintaining the droplet at a predetermined undercooled temperature range in the nucleation zone. The heating means may be in the nucleation zone or in the uniform droplet generation system. There may be a velocity control system for controlling the velocity of the droplets in the nucleation zone. It may include a blower system for providing a counterflowing stream of fluid in the nucleation zone. There may be a momentum dissipation zone for gradually reducing the velocity of the droplets. It may include a curved passage. The curved passage may transition from vertical to horizontal orientation. The momentum dissipation zone may also include a blower system for providing a counterflowing stream of fluid in a momentum dissipation zone. There may be an annealing zone for relieving stress in the droplets. The annealing zone may include a heater and it may include a source of inert gas and isolation means. There may be a microballoon generator for forming droplets with a hollow center. There may be a reactive gas employed following the uniform droplet generator system; the reactive gas may include oxygen or nitrogen. There may be a liquid metal atmosphere following the droplet generator system so that the droplets pass through the liquid metal prior to solidification; the liquid metal could be gallium, indium, tin, antimony, zinc, copper or bismuth or an alloy thereof. The microballoon generator may include means for injecting a bubble of inert gas into each droplet formed in the uniform droplet production system. Droplets may be approximately 750 microns to 1250 microns in diameter. They may be one millimeter in diameter. The uniform droplet generator system may include a container for holding a liquid melt, an aperture in a container for releasing the liquid, a vibrator device for controlling formation of the droplets and a control device for sensing the size of the droplets released and operating the vibrator device for maintaining the droplets at a uniform size. The particulate may be doped silicon and the dopant may be Ga, In, Ge. Sn, As, Sb, Bi.

The invention also features a method for producing single crystal particulate in near spherical shape including producing uniform monosized near spherical droplets; droplet in the nucleation zone to initiate the single crystal growth in the droplet.

In a preferred embodiment the particulate may be a semiconductor such as silicon. Seeding may include contacting the droplet with a single crystal particle of the same material as the particulate. Contacting the droplet may include engaging with the droplet a probe having a single crystal particle of the same material as the particulate. Contacting may include launching at the droplet a single crystal particle of the same material as the particulate. The temperature of the droplet may be sensed in nucleation zone and the temperature of the droplets may be adjusted to maintain a predetermined temperature range in that zone. Adjusting the temperature may include adjusting the heat applied to the forming droplet or to droplets in the nucleation zone, or both. The velocity of the droplets may be controlled in the nucleation zone. The control of the velocity may be done by introducing a counterflow fluid stream in the nucleation zone. The momentum of the droplets may be gradually reduced in the momentum dissipation zone. The reduction of the momentum may include guiding a droplet through a curved path. That curved path may change the droplet's direction from vertical to horizontal. Reducing the momentum of the droplets may also include introducing a counterflowing fluid stream in the momentum dissipation zone. The droplets may be annealed to relieve stress. The annealing may include heating in the absence of air. A bubble of inert gas may be introduced into each droplet as it is produced. Droplets may be formed from approximately 750 microns to 1250 microns in diameter, for example one millimeter.

The invention also features a single crystal near spherical particulate made by the method of the invention. The invention also features a single crystal near spherical particulate which may be made of a semiconductor or silicon. The invention also features a single crystal near spherical particulate having a near spherical shell and a hollow core and may be made of a semiconductor or silicon.

DISCLOSURE OF PREFERRED EMBODIMENT

Other objects, features and advantages will occur to those skilled in the art from the following description of a preferred embodiment and the accompanying drawings, in which.

Semiconductor materials in general are difficult to form into spheres by such techniques as gas atomization, rotary atomization or shotting. Indeed, liquid germanium droplets are known to distort into highly irregular shapes upon solidification. [See, for instance, R. F. Cochrane, P. V. Evans, and A. L. Greer, "Containerless Solidification of Alloys in a Drop-tube,", Mat. Sci. Eng. 98, 99–103 (1988).] It is believed that silicon and germanium exhibit similar macroscopic and microscopic solidification behavior because both materials are close-packed metallic liquids and tetrahedrally-bonded semiconducting solids with an adamantine (diamond-like) crystal structure. Thus, both materials exhibit a volume expansion upon solidification, high entropies of fusion, and similar mechanisms of crystal growth on a microscopic level. Other semiconductor materials, such as the so-called "III–V compounds" (GaAs, GaSb, InSb, InP, InAs), also exhibit a volume expansion upon solidification of a similar magnitude, a transition from a close-packed metallic liquid state to an adamantine semiconducting solid-state, and mechanisms of crystal growth similar to those of Ge and Si. [See O. Madelung, M. Schultz, H. Weiss, Eds. "Semiconductors: Technology of III–V, II–VI and Non-tetrahedrally Bonded Compounds,", Landold-Börnstein, vol. 17d, p. 27 (Springer-Verlag, New York, 1984)]. Thus, although the technology disclosed herein is discussed most specifically with reference to silicon, it is clear that it can be applied, with suitable minor modifications, to any material composed primarily of any of the tetrahedrally-bonded semiconductor substances, including binary, ternary, quartenary (including $CuInGaSe_2$), and higher compounds. Herein semiconductor means adamantine semiconductors in pure and doped form. Dopants may include, e.g., B, Al, Ga, In, N, P, As, Sb, Se and Ge. Certain dopants may be added to improve sphericity, such as Ga, In, Ge, In, As, Sb and Bi, for example. A partial listing of the many semiconductor materials to which this invention applies may be found in the CRC Handbook of Chemistry and Physics, 71 st Ed., David R. Lide ed, pages 1254–1256.

Figure 1:
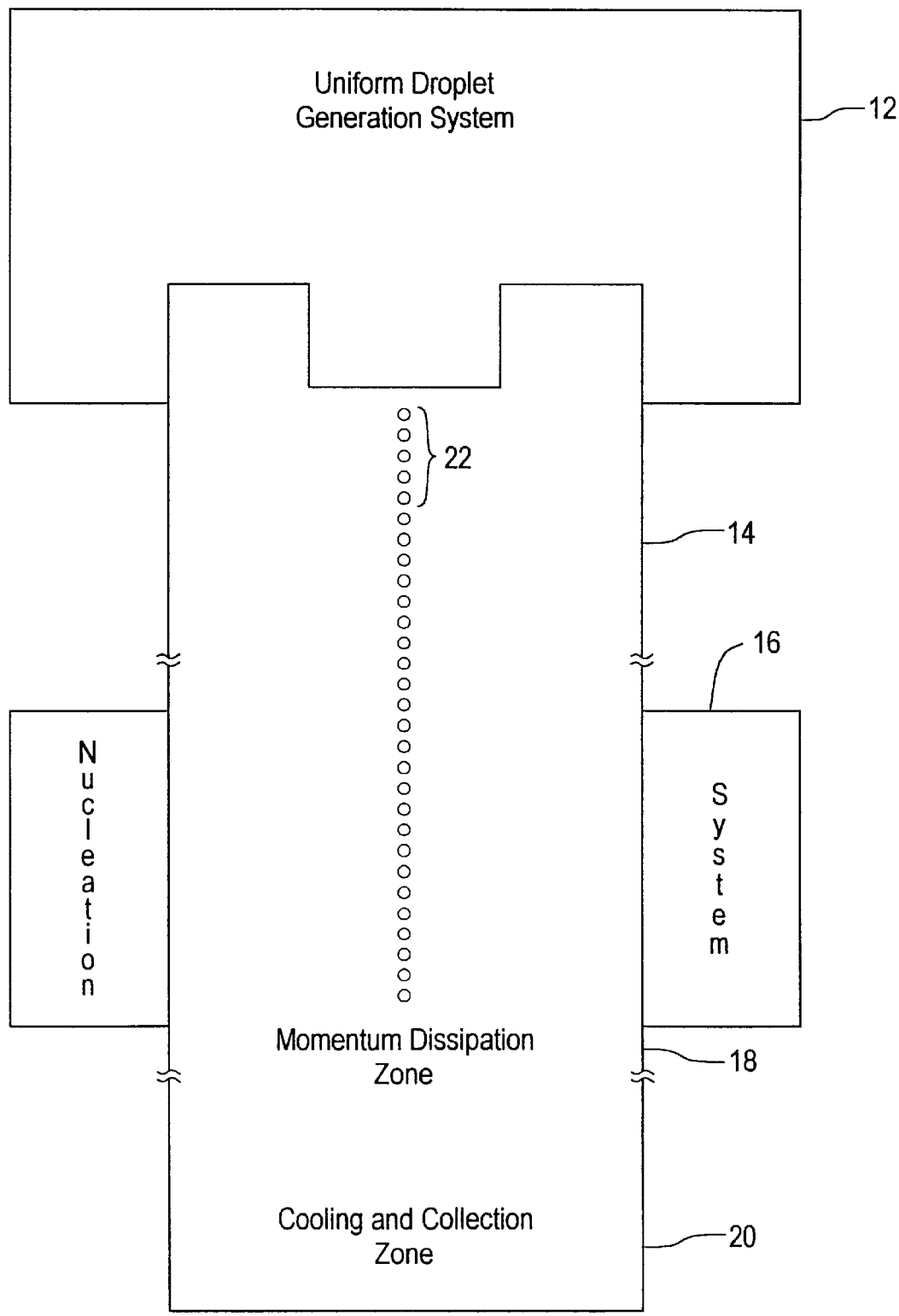
FIG. 1 is a simplified schematic block diagram of an apparatus for producing single crystal particulate in near spherical shape according to this invention.

There is shown in FIG. 1 an apparatus for producing single crystal particulate 10 in near spherical shape including a uniform droplet generation system 12 having a vibration shaft and droplet orifice as described by Professor Jung-Hoon Chun of M.I.T. in U.S. Pat. No. 5,266,098, Prof. Chun also describes measurement and feedback controls to provide precise droplet size and production rates. The frequency of droplet production must be carefully controlled to prevent droplet collisions especially as the droplets pass through this nucleation zone.

A standard quartz crucible may be used for melting the semiconductor or other material such as silicon, and a continuous feed device may be used to constantly supply the crucible. At any one time only a very small amount of silicon is molten in the crucible, thus providing a-short residence time of the molten silicon in the crucible to minimize oxygen pickup by the silicon. For example, as little as 40 grams can be molten and using a droplet production rate of 4 grams per minute would ensure that the mean contact time of the silicon with the crucible was only on the order of ten minutes. This would compare very favorably with the Czochralski crystal growth in which silicon processed in batches must reside in contact with the crucible for periods of an hour or more. Use of even smaller molten masses will further reduce the contact time. If even higher purity is desired the continuous feed system could be coupled with cold hearth copper crucible induction melt systems initially developed for the growth of very pure cubic zirconia and now being applied to such reactive materials as titanium.

The uniform droplet generation system 12 sits on top of a drop tower 14 which also includes a nucleation system 16, momentum dissipation zone 18 and collection zone 20. The nucleation system 16 below the uniform droplet droplet generation system 12 is used to control the thermal environment of the droplets 22. The nucleation system is surrounded by heaters and contains an inert gas such as He, Ar, Kr, or Xe, or reactive gas such as air, $O_2$, $N_2$; carbonaceous, borane, silane, germane, pnictide, chalcogen, halogen gases; or any mixture of inert and reactive gases, especially mixtures of this type typically used for chemical vapor deposition, ion implantation, epitaxial growth, or diffusion coating of semiconductor substrates. Rather than a reactive or an inert gas, the nucleation system could contain a reactive or inert liquid metal including gallium, indium, tin, antimony, bismuth, zinc, copper, or any other suitable liquid metal, or any alloy composed of such metals, including the binary, ternary, and higher eutectics of gallium and indium. If a liquid metal is employed as the medium in which nucleation is achieved, the preferred embodiment is similar to the apparatus shown in FIG. 1 if the density of the semiconductor is greater than the liquid metal but will be upside down if the density of the semiconductor is less than the liquid metal. The counterflowing gas velocity and pressure are sufficient to slow the passage of the droplet through the nucleation system so the droplet vibration is substantially damped before the crystal is nucleated in the droplet 22 which typically is in the range of $100\mu$–$1250\mu$. Nucleation may be accomplished by a number of means such as pricking the droplet with a silicon seed on the end of a probe or showering or spraying the droplets 22 with a seed as they pass by. Seeding the droplets requires precise timing involving vision systems and pyrometry as shown. To ensure that the droplet is in the desired undercooling prior to being seeded. For example, again using the example of four grams per minute of silicon, the desired undercooling where the droplet is seeded is 0–50° C. Once seeded, the growth time for a one millimeter droplet single crystal is on the order of one minute. The droplet must be completely solidified before leaving the nucleation zone. The actual time required by the droplet is dependent on droplet size, gas temperature, gas velocity, gas pressure and gas type. The values for the above operating parameters are easily determined by those skilled in the art by the use of Stokes Settling Law and the equation governing heat loss from a small sphere in a convective environment. The droplet motion must be precisely controlled to insure complete solidification and to avoid collision with other droplets. Static gas would work but would require extended drop lengths.

An annealing and momentum conversion zone may be provided at the bottom of the chamber. Semiconductor materials have a tendency to fracture due to a sensitivity to mechanically and thermally induced stresses. One way of absorbing the momentum of the falling particle to prevent cracking is to simply slowly convert the direction of motion from vertical to horizontal via the use of a curved section of pipe. Once the motion of the solidified particle is horizontal it may be allowed to come to rest or continue to be transported slowly in an annealing zone. The annealing zone may be maintained at about 1380° C. and the particles will anneal within a few minutes. Temperatures as low as 1200° C. may be employed, but at the cost of increased annealing times of up to 3–5 hours and even longer. If a vacuum anneal is desired the annealing zone may be isolated by adding a gate valve and evacuating it with a conventional vacuum pump. The uniform droplet generation system 12 may include means to produce bubbles as described in U.S. Pat. No. 4,582,534. In this case molten silicon bubbles are produced rather than droplets. Undercooling nucleation and growth of single crystal hollow spheres is accomplished with the same means as the droplets, but because the droplets are hollow the solidifying silicon has room to expand internally and the droplets will retain a more nearly spherical shape after solidification.

Figure 2:
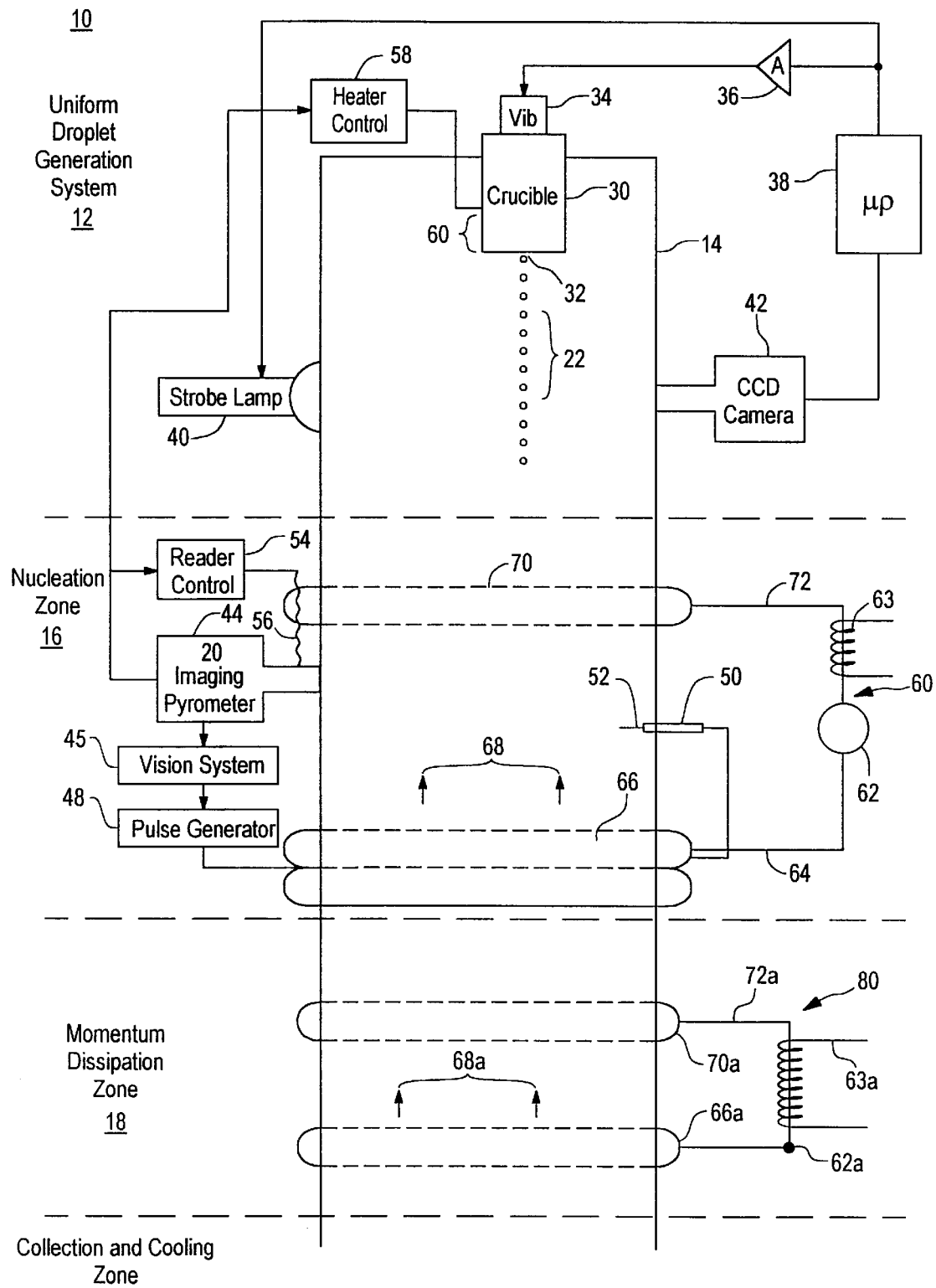
FIG. 2 is a more detailed schematic diagram of one implementation of the apparatus of FIG. 1 showing the droplet generation system, nucleation zone and momentum dissipation zone in greater detail.
Figure 3:
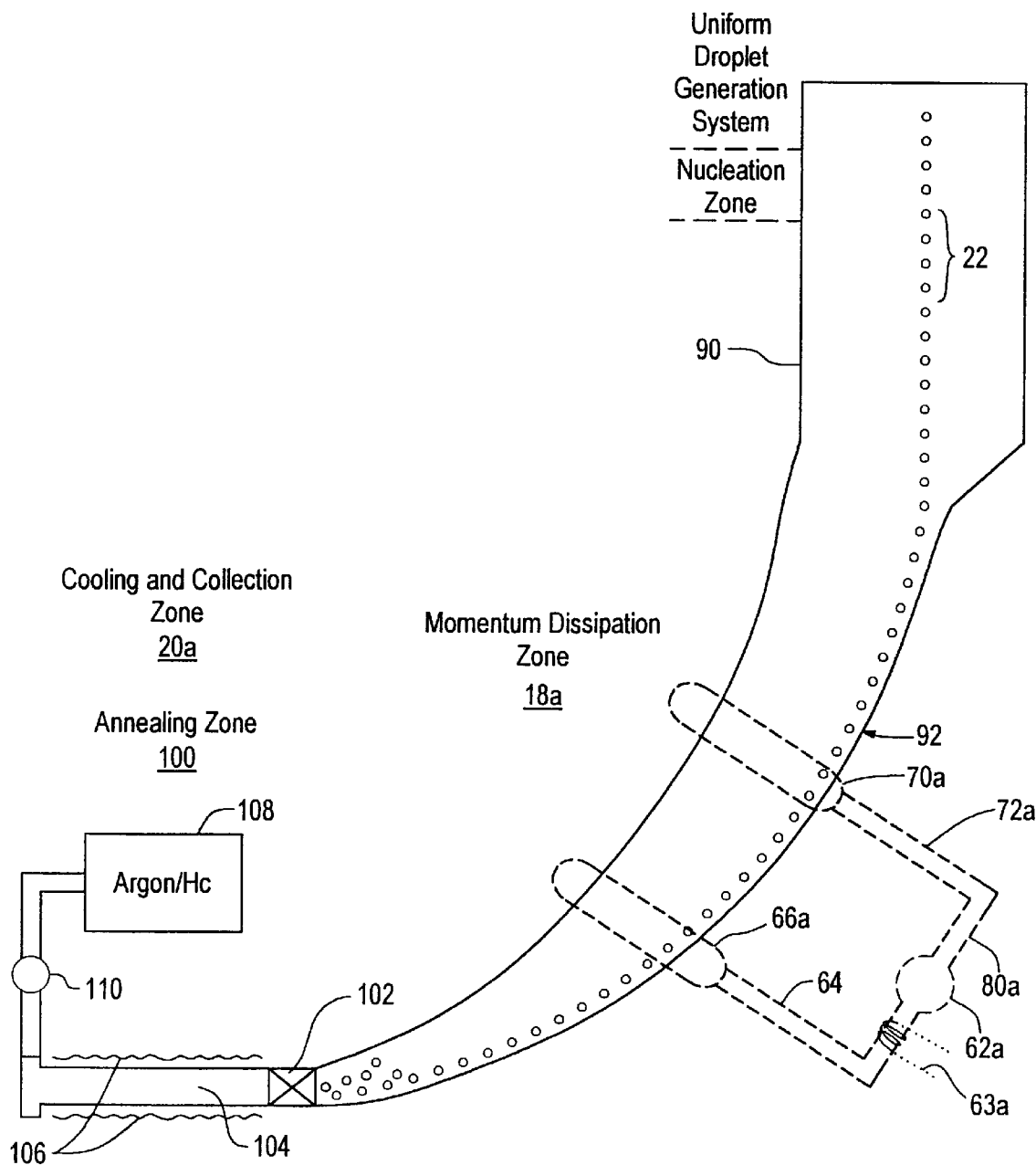
FIG. 3 is a view similar to FIG. 1 showing an alternative implementation of the momentum dissipation zone and an annealing zone according to this invention.
Figure 4:
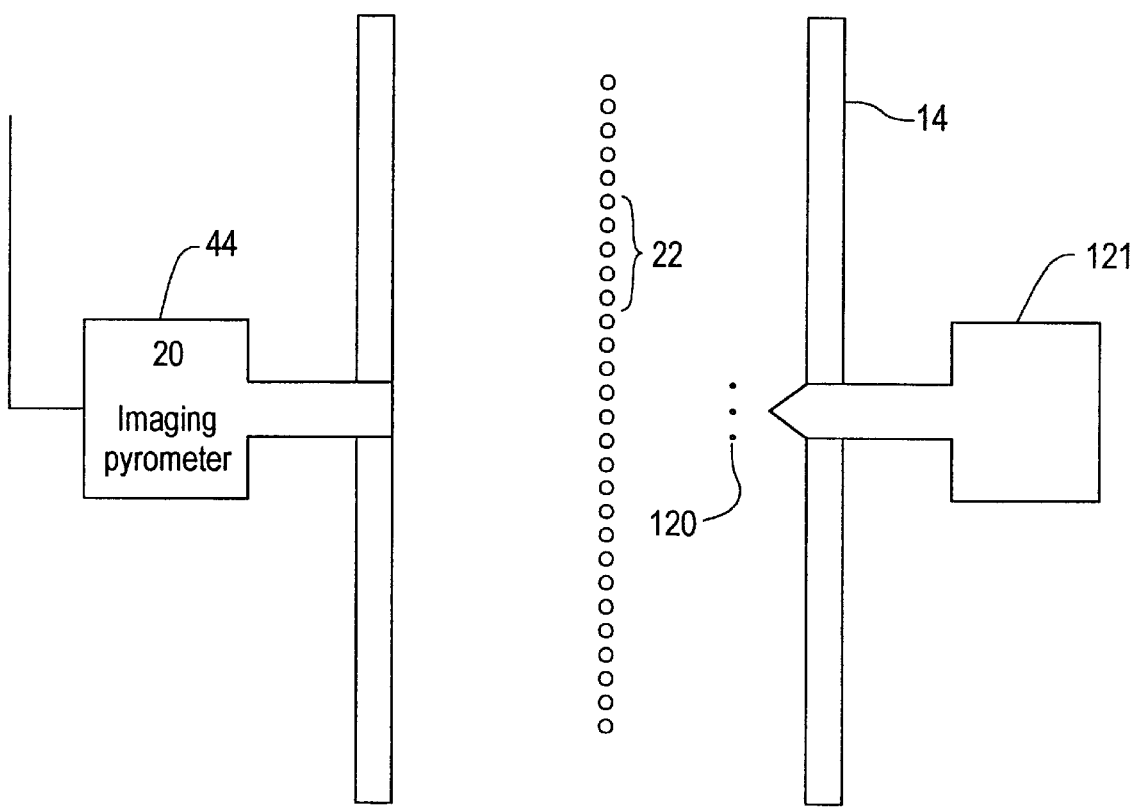
FIG. 4 is an enlarged detailed view of a portion of the nucleation zone of FIG. 2 with an alternative seeding device according to this invention.
Figure 5:
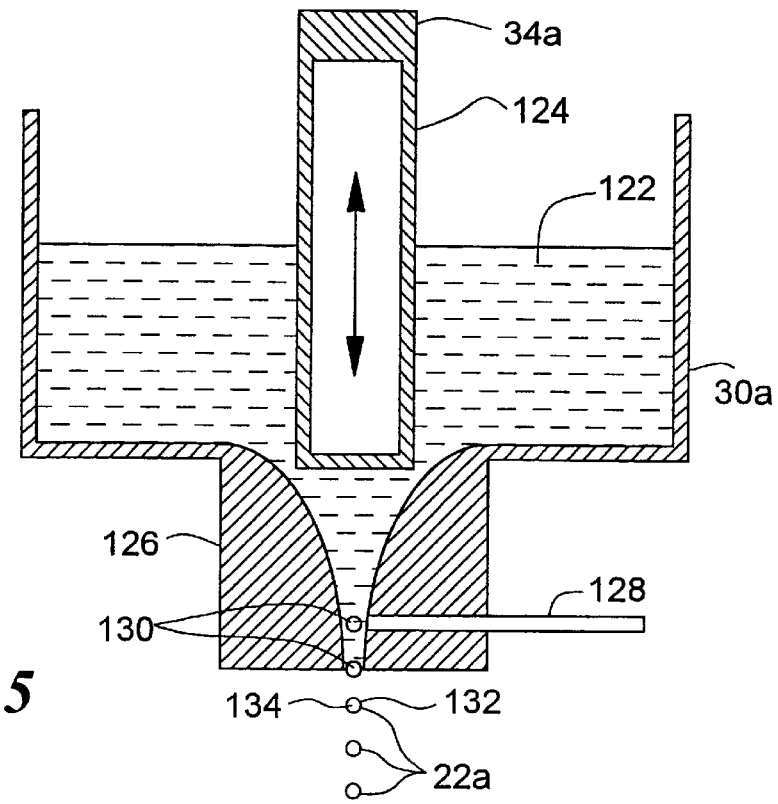
FIG. 5 is an enlarged detailed view of the crucible and vibrator of FIG. 2 with a side injector for creating hollow near spheres according to this invention.
Figure 6:
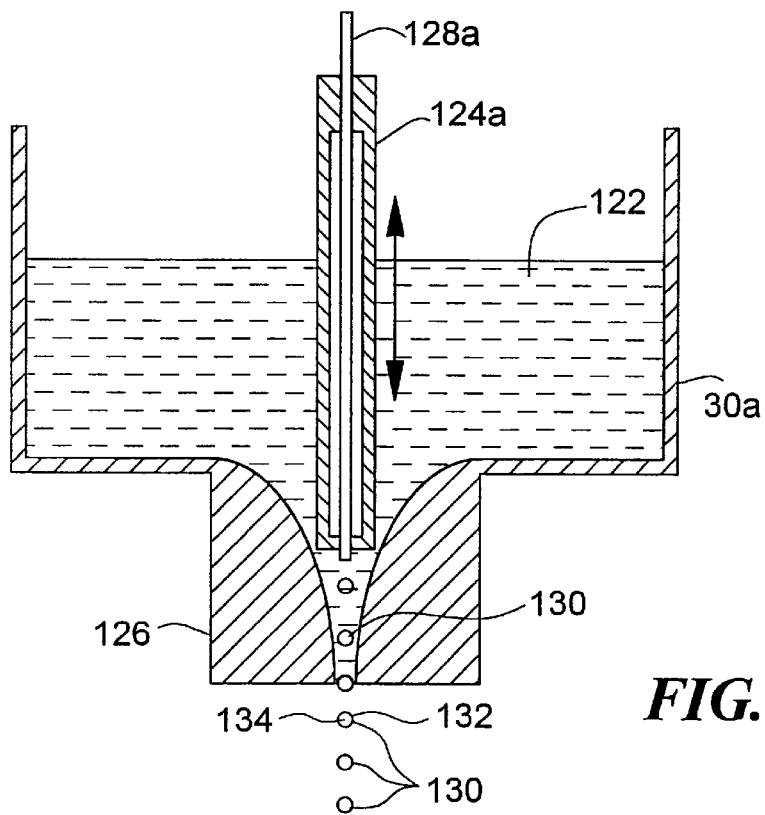
FIG. 6 is an enlarged detailed view of the crucible and vibrator of FIG. 2 with a central injector for creating hollow near spheres according to this invention.
Figure 7:
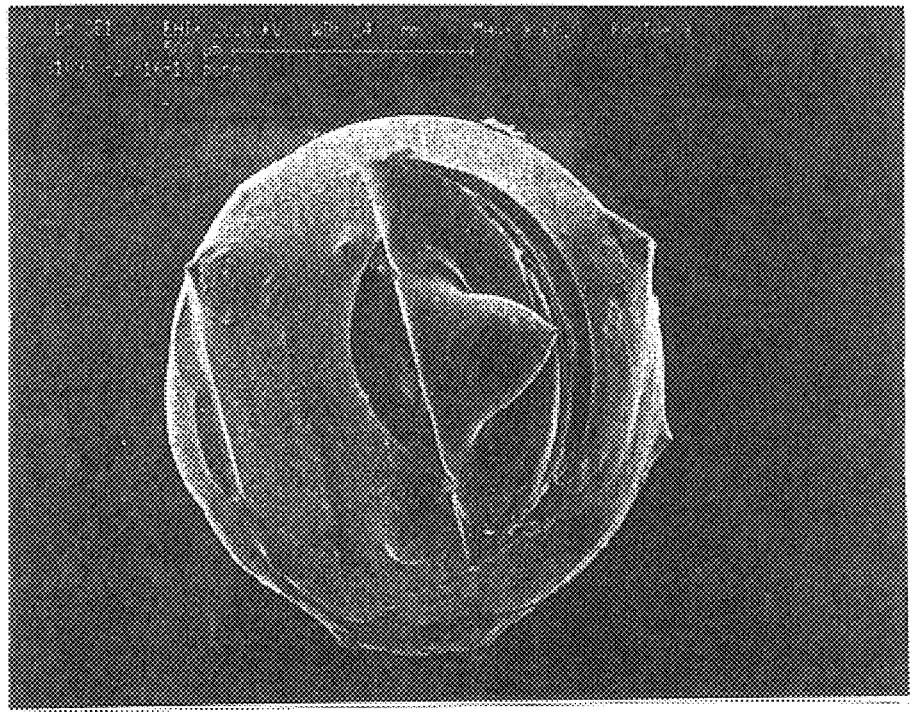
FIG. 7 is an SEM micrograph of silicon solidified conventionally.
Figure 8:
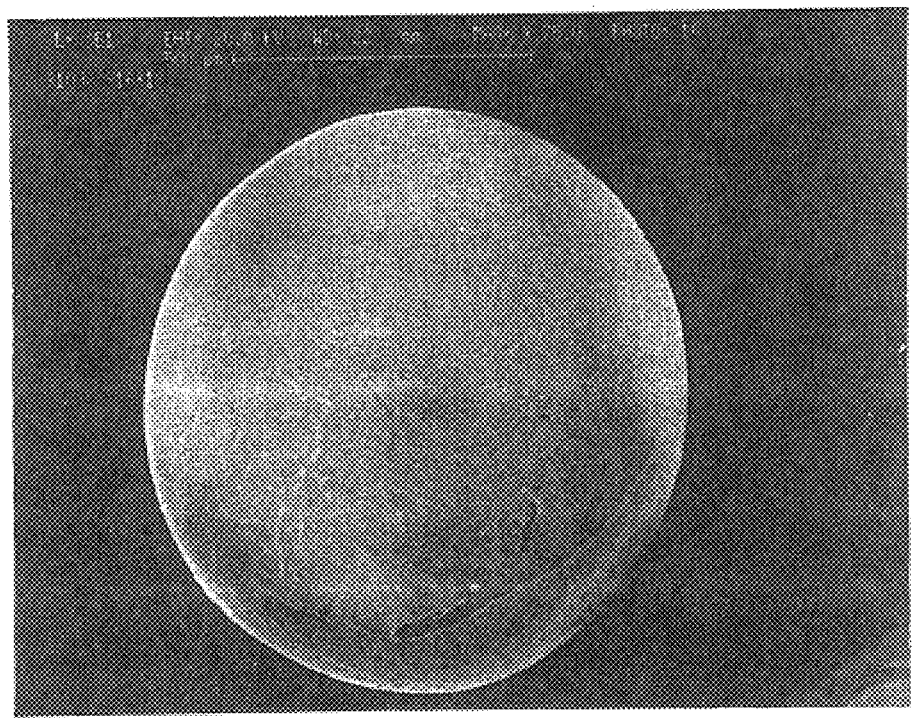
FIG. 8 is an SEM micrograph of a solid near sphere according to this invention.
Figure 9:
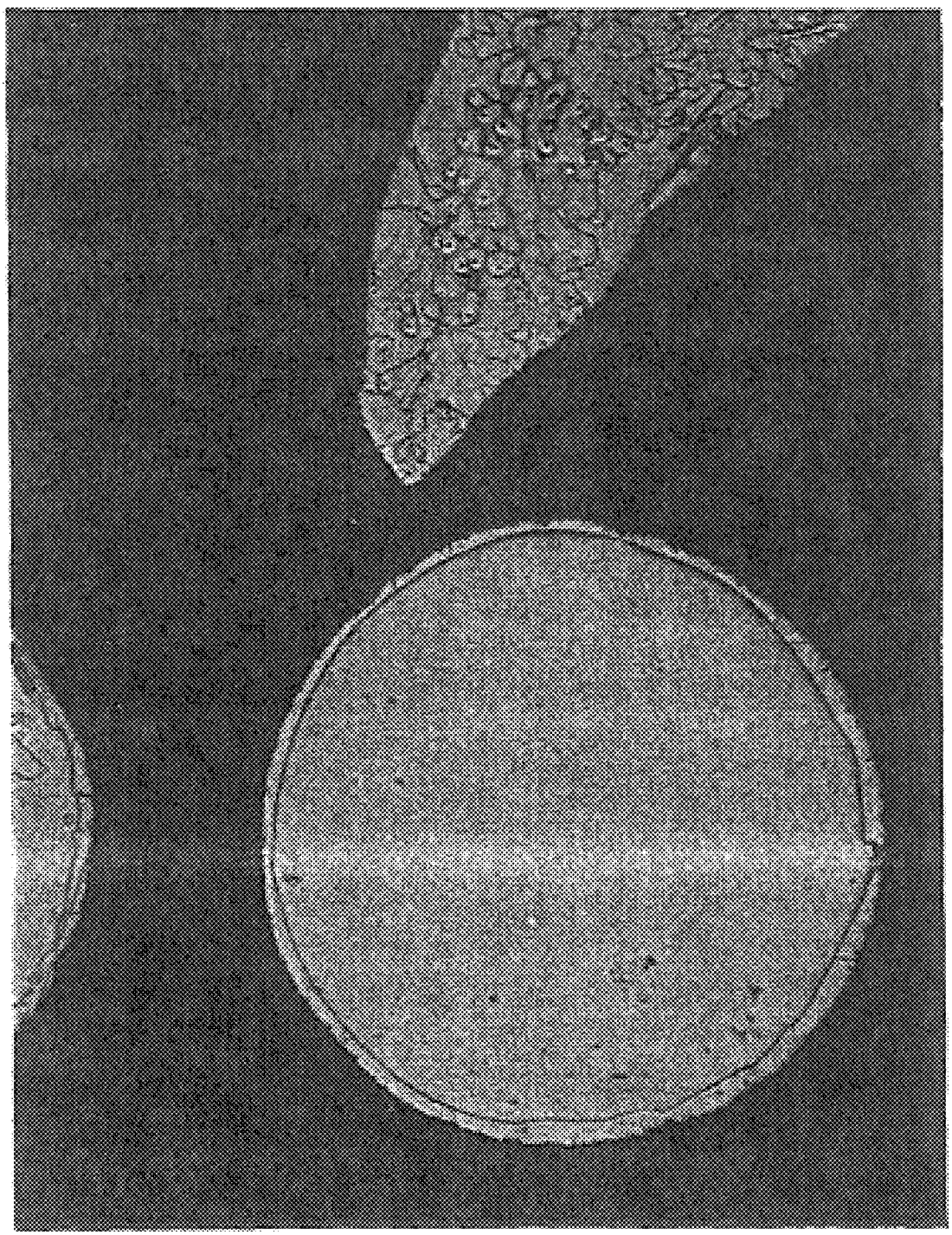
FIG. 9 is an optical micrograph of a cross section of a solid near sphere of silicon showing its single crystal structure.
Figure 10:
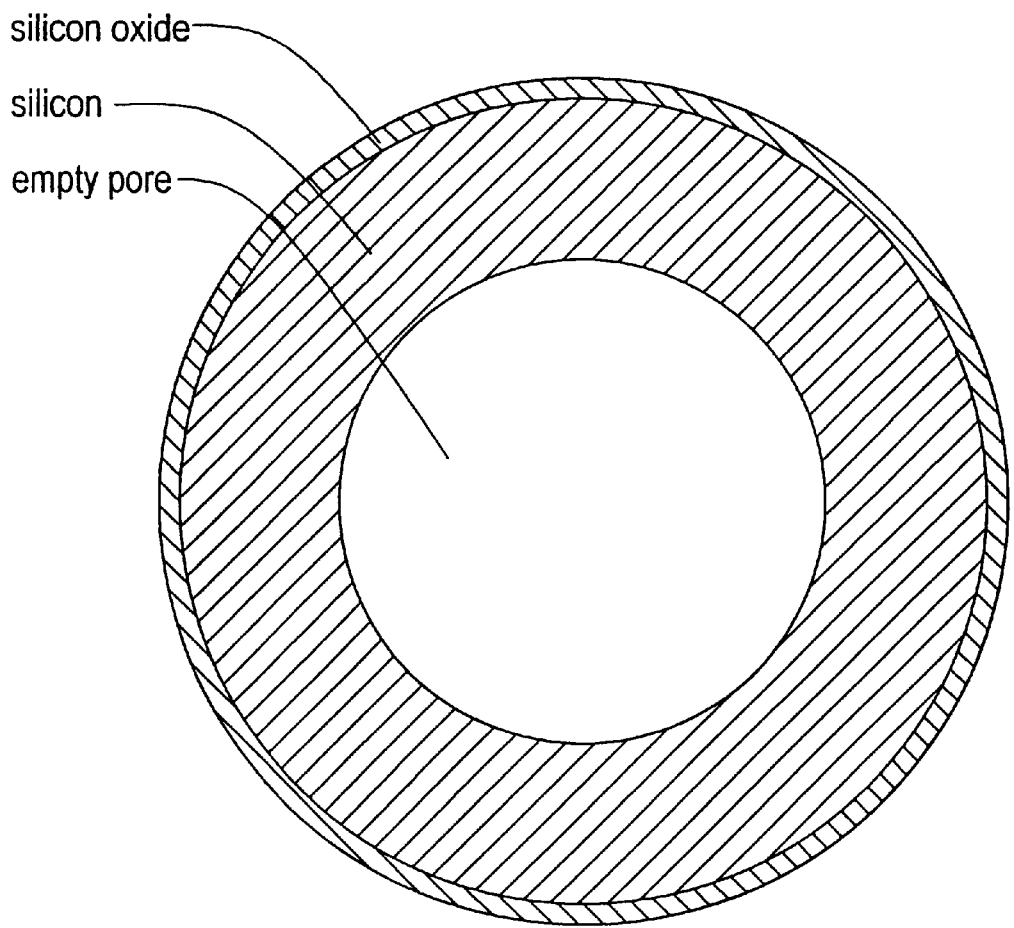
FIG. 10 is an enlarged illustrative view of a hollow silicon sphere having a refractory oxide coating.
Figure 11:
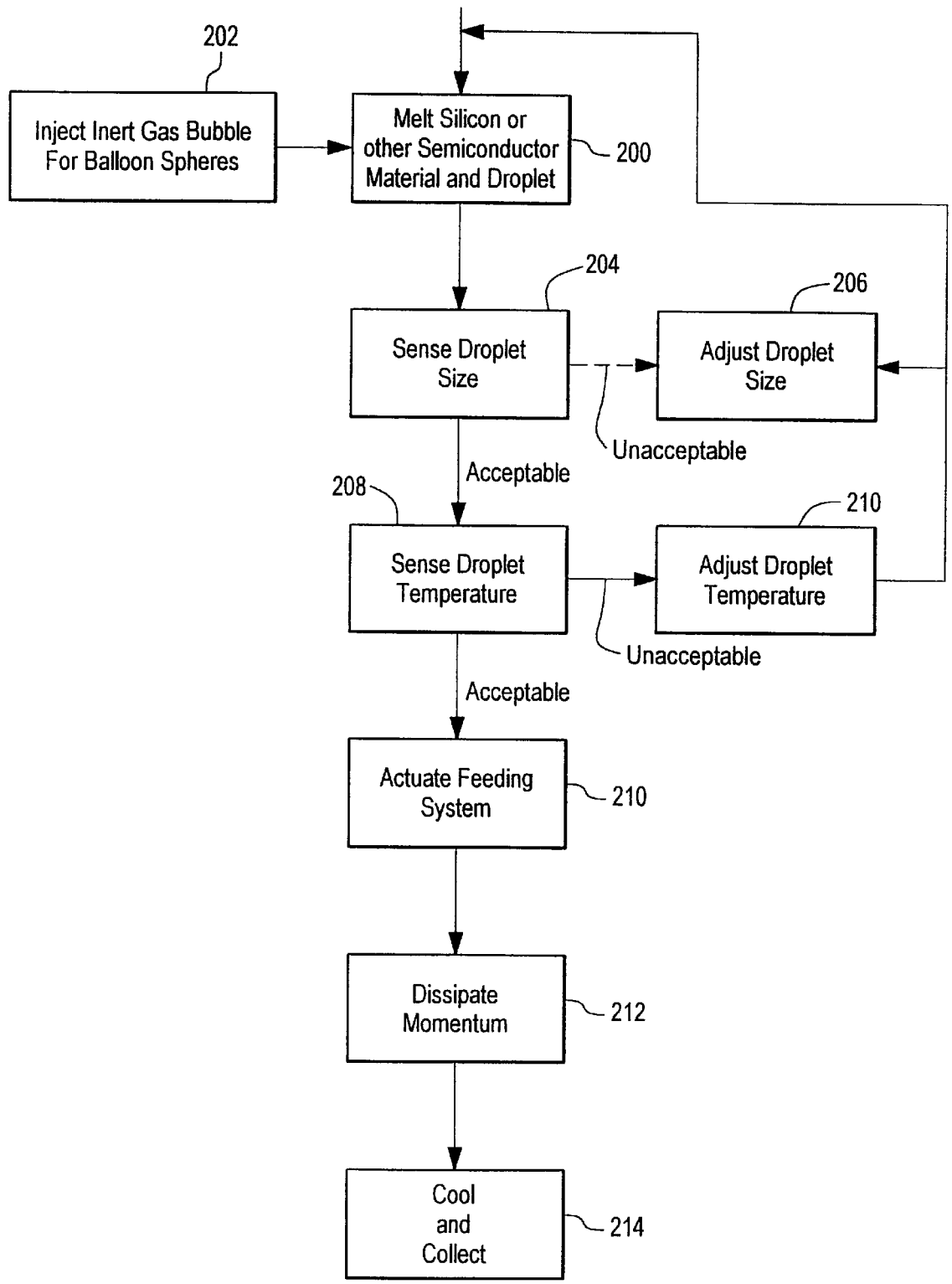
FIG. 11 is a flow chart of the method according to this invention.

The uniform droplet generation system 12, FIG. 2, may include a standard crucible 30 in which silicon or some other suitable material such as a semiconductor is melted. The droplets 22 forming at orifice 32 issue under control of the vibrator 34 driven by amplifier 36 which is in turn controlled by microprocessor 38 as taught by Chun, supra. A strobe lamp 40 driven by microprocessor 38 illuminates droplets 22 as they pass in front of CCD camera 42. An analysis by microprocessor 38 of the output from camera 42 indicates whether the droplets are too large, too small, or properly sized. If they are too large, the signal to vibrator 34 is adjusted to increase the vibration frequency; if the droplets are too small, the vibration frequency is decreased. As the droplets 22 continue to fall they enter the nucleation system 16 where they are individually identified and their temperature sensed by a two-dimensional imaging pyrometer 44. If the position of the particular droplet identified is confirmed by imaging system 46, pulse generator 48 produces a pulse to operate solenoid 50 and drive nucleating needle 52 to seed that droplet. Heterogeneous nucleation may be stimulated by other means such as vibration, a pressure pulse or even a laser pulse. If the temperature of the droplets is not at the proper undercooled temperature for nucleating, then heater control 54 may be operated to increase or decrease the heating of heater 56 or heater control 58 may do likewise with heater 60 in uniform droplet generation system 12. The apparatus may employ either one or both of the heaters and heater controls for this purpose. The temperature of the droplets may also be controlled by having them move more slowly or spend more dwell time within the nucleation zone 16. This can be accomplished by using a blower system 60 wherein a blower motor 62 feeds a gas, typically an inert gas such as those mentioned above, through input channel 64 to outlet 66 to provide a counterflow of the gas upwardly as indicated by arrow 68 against the flow of droplets 22. The gas is collected at outlet 70 and returned through channel 72 to blower motor 62. A heat exchanger 63 may be used to control the temperature of the gas being used to create the counterflow stream at 68. The momentum may be dissipated or arrested using a blower system 80 similar to blower system 60 shown in the nucleation zone and would have the same parts and could also use a heat exchanger, all being referred to with the same reference numerals as for blower system 60 but accompanied by a lower case letter a.

Although the apparatus 10 including the cooling tower 14 has been depicted in FIG. 2 as being upright and vertical, this is not a necessary limitation of the invention as the entire system as shown in FIG. 2 could be turned upside down or could be operated on its side or at an inclination, with suitable accommodation being made. Additionally the tower 14 is shown for schematic purposes as being much larger in diameter than the droplets. To incur an aerodynamic centering the tower diameter could be within 1½ droplet diameters.

In an alternative construction, momentum dissipation zone 18*a*, FIG. 3, may rely on a change of direction from the vertical to the horizontal by using a curved pipe 90 that slowly and gently changes the direction of the falling stream of droplets 22 as they strike its lower side 92. In addition, a blower system 80*a* similar in all respects to blower system 80, FIG. 2, may be employed. Also shown in FIG. 3 is the cooling and collection zone 20*a* incorporating an annealing zone 100 fed by gate valve 102 and having a chamber 104 suitably heated by heaters 106 to provide the proper annealing temperatures for the proper period of time. For example, silicon can be annealed using temperatures ranging from just below the melting point (1420° C.) down to about 1200° C. At very high temperatures annealing is accomplished within a few minutes, at 1200° C. annealing can take up to 5 hours. It is noted the momentum conversion zone is preferably not a cold zone. The particles are allowed to substantially cool below 1200° C., if at all, only after they have essentially stopped moving. Furthermore, a source 108 of pressurized inert gas, argon or helium, for example, can be employed in conjunction with a vacuum pump 110 for evacuating chamber 104 and filling it with the selected/inert or reactive gas.

Although in FIG. 2 a solenoid 50 with needle 52 was indicated as the means for introducing the nucleation seed to the droplet, this is not a necessary limitation of the invention. For example, as shown in FIG. 4, nucleation can be induced by a seed launched from a pneumatic tube, a pressure pulse from a piezo electric crystal, a beam from a laser, or a vibration from a sonic source, all of which are represented at 121, FIG. 4.

If it is desired to have hollow or balloon spheres instead of solid spheres, this can be accomplished using a modified form of the hollow sphere or microballoon generator as described by Torobinin in U.S. Pat. No. 4,582,534. Such a device is shown in FIG. 5, using a crucible 30*a* which contains the melt such as silicon melt 122 and has positioned in it a vibrator 34*a* such as a piezoelectric transducer or wound electrical solenoid which drives a refractory plunger 124. In the nozzle 126 below the plunger 124 there may be inserted an inert gas injector 128 that injects a bubble of inert gas 130 into the droplets as they are forming so that when they form they form hollow or balloon shaped droplets 22*a* that have a very near spherical shell 132 with a hollow core 134. The injector may also be provided centrally down the middle of refractory plunger 124*a*, FIG. 6.

FIG. 7 shows the irregular particulate that results when silicon is solidified conventionally. The resultant silicon solid near spheres shown in FIG. 8 are made in accordance with this invention. The cross section shown in FIG. 9 has a featureless microstructure characteristic of single crystals. By using the hollow droplet approach with controlled nucleation and solidification the distortion of the droplet shown in FIG. 7 can be avoided completely and due to surface tension of the liquid an outer spherical shell even more spherical than shown in FIG. 8 will result. By oxidizing the still liquid shell a hard solid spherical coating is provided and as the rest of the liquid solidifies it can expand inwardly and partially fill the internal hollow pore without causing a rupture or distortion of the spherical shell as shown schematically in FIG. 10. This oxide shell can be created by using argon containing 5% oxygen in the droplet generation and nucleation zones. 1% to 10% mixtures have been shown to work equally well. Additionally, nitride coatings have been produced using nitrogen and it is thought carbide coatings can be produced using carbonaceous gases.

The method according to this invention begins with melting the silicon or other semiconductor material and discharging the droplets, step 200, FIG. 11, and then sensing the droplet size 202. If it is desired to have the hollow or balloon type of droplet instead of the solid droplet there is injected an inert gas bubble in step 202. After the droplet is discharged the droplet size is sensed in step 204. If it is unacceptable then the droplet size is adjusted and the system returns to step 200. If the droplet is an acceptable size, then the system senses the droplet temperature in step 208. If the temperature is unacceptable the temperature is adjusted in step 210 and the system returns to step 200. If it is acceptable, the seeding system is actuated in step 210. After this the momentum is slowly dissipated in step 212 which may be accomplished as indicated for example by counterflows and/or redirection of the falling droplets. Finally, the near spheres are cooled and collected in step 214 and they may be annealed in a vacuum or in an inert gas or reactive gas atmosphere. Although the disclosed system is described using silicon or germanium, any suitable material may be used. Suitable materials include doped or pure semiconducting material consisting primarily of silicon, germanium, or any of the other tetrahedrally-bonded (adamantine) semiconductors, which include binary compounds such as the "III–V" compounds (GaAs, GaSb, InSb, InP, InAs), ternary compounds, quaternary compounds (such as $CuInGaSe_2$), and higher compounds.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. An apparatus for producing single crystal semiconductor particulate in near spherical shape comprising:

a uniform droplet generation system for producing and imparting motion to uniform, monosized near spherical droplets; and a nucleating system including a nucleating zone, a single crystal seeding device comprising means to contact said moving droplets with a seed, where the droplets are moving with respect to the source of seed, and a monitoring device for identifying the position of each of said droplets in the nucleation zone and actuating said seeding device to initiate a single crystal growth in said droplets.

2. The apparatus of claim 1 in which said nucleating system includes means for introducing a local perturbation to a droplet.

3. The apparatus of claim 2 in which said means for introducing a local perturbation includes a laser.

4. The apparatus of claim 2 in which said means for introducing a local perturbation includes means for providing a pressure pulse to a droplet.

5. The apparatus of claim 2 in which said means for introducing a local perturbation includes means for providing a vibration to a droplet.

6. The apparatus of claim 1 in which said monitoring device includes means for sensing the temperature of a droplet in the nucleation zone.

7. The apparatus of claim 6 further including heating means responsive to said means for sensing the temperature of a droplet for maintaining the droplets at an undercooled temperature range in the nucleation zone.

8. The apparatus of claim 7 in which said heating means is in said nucleation zone.

9. The apparatus of claim 7 in which said heating means is in said uniform droplet generation system.

10. The apparatus of claim 1 further including a velocity control system for controlling the velocity of said droplets in said nucleation zone.

11. The apparatus of claim 10 in which said velocity control system includes a blower system for providing a counterflowing stream of fluid in said nucleation zone.

12. The apparatus of claim 1 further including a momentum dissipation zone for gradually reducing the velocity of said droplets.

13. The apparatus of claim 12 in which said momentum dissipation zone includes a curved passage.

14. The apparatus of claim 13 in which said curved passage transitions from vertical to horizontal orientation.

15. The apparatus of claim 12 in which said momentum dissipation zone includes a blower system for providing a counterflowing stream of fluid in said momentum dissipation zone.

16. The apparatus of claim 1 further including an annealing zone for relieving stress in said droplets.

17. The apparatus of claim 16 in which said annealing zone includes a heater.

18. The apparatus of claim 16 in which said annealing zone includes a source of inert gas and isolation means.

19. The apparatus of claim 1 further including a microballoon generator for forming said droplets with a hollow center.

20. The apparatus of claim 1 in which a reactive gas atmosphere is provided for said droplets following said uniform droplet generator system.

21. The apparatus of claim 20 wherein the reactive gas contains oxygen.

22. The apparatus of claim 20 wherein the reactive gas contains nitrogen.

23. The apparatus of claim 1 in which a liquid metal atmosphere is employed following said uniform droplet generator system so that the droplets pass through the liquid metal prior to solidification, the liquid metal being gallium, indium, tin, antimony, bismuth, zinc, copper or an alloy thereof.

24. The apparatus of claim 19 in which said microballoon generator includes means for injecting a bubble of inert gas into each droplet formed in said uniform droplet production system.

25. The apparatus of claim 1 in which said droplets are approximately $100\mu$ to $125\ \mu m$ in diameter.

26. The apparatus of claim 1 in which said droplets are approximately one millimeter in diameter.

27. The apparatus of claim 1 in which said uniform droplet generation system includes a container for holding a quantity of the particulate in liquid form, an aperture in said container for releasing the liquid a droplet at a time, a vibration device for controlling the release of said droplets and a control device for sensing the size of said droplets released and operating said vibrator device for maintaining the droplets at a uniform size.

28. An apparatus for producing single crystal semiconductor silicon particulate in near spherical shape comprising:
   a uniform droplet generation system for producing and imparting motion to uniform, monosized near spherical droplets; and
   a nucleating system including a nucleating zone, a single crystal seeding device comprising means to contact said moving droplets with a seed, where the droplets are moving with respect to the source of seed, and a monitoring device for identifying the position of each of said droplets in the nucleation zone and actuating said seeding device to initiate a single crystal growth in said droplets.

29. An apparatus for producing single crystal semiconductor doped silicon particulate in near spherical shape comprising:
   a uniform droplet generation system for producing and imparting motion to uniform, monosized near spherical droplets; and
   a nucleating system including a nucleating zone, a single crystal seeding device comprising means to contact said moving droplets with a seed, where the droplets are moving with respect to the source of seed, and a monitoring device for identifying the position of each of said droplets in the nucleation zone and actuating said seeding device to initiate a single crystal growth in said droplets.

30. An apparatus for producing single crystal semiconductor particulate in near spherical shape comprising:
   a uniform droplet generation system for producing and imparting motion to uniform, monosized near spherical droplets; and
   a nucleating system including a nucleating zone, a single crystal seeding device comprising means to contact said moving droplets with a seed, where the droplets are moving with respect to the source of seed, and a monitoring device for identifying the position of each of said droplets in the nucleation zone and actuating said seeding device to initiate a single crystal growth in said droplets; said nucleating system further includes means for contacting said droplets with single crystal particles of the same material as said particulate.

31. An apparatus for producing single crystal semiconductor doped silicon particulate in near spherical shape, where the dopant is one of the group of elements consisting of Ga, In, Ge, Sn, As, Sb and Bi, the apparatus comprising:
   a uniform droplet generation system for producing and imparting motion to uniform, monosized near spherical droplets; and
   a nucleating system including a nucleating zone, a single crystal seeding device comprising means to contact said moving droplets with a seed, where the droplets are moving with respect to the source of seed, and a monitoring device for identifying the position of each of said droplets in the nucleation zone and actuating said seeding device to initiate a single crystal growth in said droplets.

32. An apparatus for producing single crystal semiconductor particulate in near spherical shape comprising:

a uniform droplet generation system for producing and imparting motion to uniform, monosized near spherical droplets; and a nucleating system including a nucleating zone, a single crystal seeding device comprising means to contact said moving droplets with a seed, where the droplets are moving with respect to the source of seed, where said seed is a single crystal particle of the same material as said particulate, and where said means to contact includes a probe, and a monitoring device for identifying the position of each of said droplets in the nucleation zone and actuating said seeding device to initiate a single crystal growth in said droplets.

33. An apparatus for producing single crystal semiconductor particulate in near spherical shape comprising:

a uniform droplet generation system for producing and imparting motion to uniform, monosized near spherical droplets; and a nucleating system including a nucleating zone, a single crystal seeding device comprising means to contact said moving droplets with a seed, where the droplets are moving with respect to the source of seed, where said seed is a single crystal particle of the same material as said particulate, and where said means to contact includes a particle launcher, and a monitoring device for identifying the position of each of said droplets in the nucleation zone and actuating said seeding device to initiate a single crystal growth in said droplets.

\* \* \* \* \*